United States Patent
Kagami et al.

(10) Patent No.: US 8,377,207 B2
(45) Date of Patent: Feb. 19, 2013

(54) PURGE GAS ASSEMBLY

(75) Inventors: Tsuyoshi Kagami, Shizuoka (JP);
Osamu Irino, Shizuoka (JP); Nobuyuki Kato, Shizuoka (JP); Harunori Ushikawa, Shizuoka (JP)

(73) Assignee: ULVAC, Inc., Kanagawa (JP)

( * ) Notice: Subject to any disclaimer, the term of this patent is extended or adjusted under 35 U.S.C. 154(b) by 483 days.

(21) Appl. No.: 12/597,589

(22) PCT Filed: Apr. 23, 2008

(86) PCT No.: PCT/JP2008/057846
§ 371 (c)(1),
(2), (4) Date: Dec. 29, 2009

(87) PCT Pub. No.: WO2008/139871
PCT Pub. Date: Nov. 20, 2008

(65) Prior Publication Data
US 2010/0139556 A1 Jun. 10, 2010

(30) Foreign Application Priority Data
May 9, 2007 (JP) .................. 2007-124860

(51) Int. Cl.
*C23C 16/455* (2006.01)
*C23C 16/458* (2006.01)
*C23F 1/00* (2006.01)
*H01L 21/306* (2006.01)
*C23C 16/06* (2006.01)
*C23C 16/22* (2006.01)

(52) U.S. Cl. .................. 118/715; 118/728; 156/345.33; 156/345.51

(58) Field of Classification Search .................. 118/715, 118/728; 156/345.33, 345.51
See application file for complete search history.

(56) References Cited

U.S. PATENT DOCUMENTS
4,990,374 A * 2/1991 Keeley et al. ............ 427/255.28
5,308,594 A * 5/1994 Chen ............................. 117/222
(Continued)

FOREIGN PATENT DOCUMENTS
JP 09082653 A * 3/1997
JP 11-36076 A 2/1999
(Continued)

OTHER PUBLICATIONS
International Search Report for PCT Patent App. No. PCT/JP2008/057846(Jun. 3, 2008).

*Primary Examiner* — Rudy Zervigon
(74) *Attorney, Agent, or Firm* — Cermak Nakajima LLP; Tomoko Nakajima

(57) ABSTRACT

In a purge gas assembly provided: in an outer circumference portion of a substrate stage, with a shoulder portion offset downward below a substrate mounting surface on an upper end of the substrate stage; a purge ring enclosing a stepped circumferential surface between the substrate mounting surface and the shoulder portion; and an annular gas ejection passage for ejecting the purge gas, the gas ejecting passage being defined between the stepped circumferential surface and an inner circumferential surface of the purge ring, an arrangement is made such that the purge gas can be ejected uniformly from the gas ejection passage over the entire circumference thereof and that the deposition of a film on an upper surface of the purge ring can also be restricted, and further that the construction is simplified. The purge ring has formed therein an annular groove which recesses from a lower surface thereof upward.

7 Claims, 2 Drawing Sheets

U.S. PATENT DOCUMENTS

| | | | |
|---|---|---|---|
| 5,326,725 A * | 7/1994 | Sherstinsky et al. | 438/778 |
| 5,516,367 A * | 5/1996 | Lei et al. | 118/725 |
| 5,574,247 A * | 11/1996 | Nishitani et al. | 118/708 |
| 5,578,532 A * | 11/1996 | van de Ven et al. | 438/584 |
| 5,620,525 A * | 4/1997 | van de Ven et al. | 118/728 |
| 5,688,331 A * | 11/1997 | Aruga et al. | 118/725 |
| 5,766,365 A * | 6/1998 | Umotoy et al. | 118/728 |
| 5,769,951 A * | 6/1998 | van de Ven et al. | 118/725 |
| 5,800,686 A * | 9/1998 | Littau et al. | 204/298.07 |
| 5,843,233 A * | 12/1998 | van de Ven et al. | 118/715 |
| 5,882,417 A * | 3/1999 | van de Ven et al. | 118/728 |
| 5,888,304 A * | 3/1999 | Umotoy et al. | 118/720 |
| 5,925,411 A * | 7/1999 | van de Ven et al. | 427/248.1 |
| 5,953,630 A * | 9/1999 | Maeda et al. | 438/680 |
| 6,033,480 A * | 3/2000 | Chen et al. | 118/715 |
| 6,040,011 A * | 3/2000 | Yudovsky et al. | 427/255.28 |
| 6,045,862 A * | 4/2000 | Mizukami et al. | 427/248.1 |
| 6,179,924 B1 * | 1/2001 | Zhao et al. | 118/725 |
| 6,223,447 B1 * | 5/2001 | Yudovsky et al. | 34/58 |
| 6,231,674 B1 * | 5/2001 | Chen et al. | 118/720 |
| 6,248,176 B1 * | 6/2001 | Yudovsky et al. | 118/715 |
| 6,306,244 B1 * | 10/2001 | Kennedy et al. | 156/345.51 |
| 6,350,320 B1 * | 2/2002 | Sherstinsky et al. | 118/715 |
| 6,375,748 B1 * | 4/2002 | Yudovsky et al. | 118/728 |
| 6,489,239 B1 * | 12/2002 | Jang et al. | 438/680 |
| 6,494,955 B1 * | 12/2002 | Lei et al. | 118/715 |
| 6,544,340 B2 * | 4/2003 | Yudovsky | 118/728 |
| 6,589,352 B1 * | 7/2003 | Yudovsky et al. | 118/729 |
| 6,702,900 B2 * | 3/2004 | Yeh et al. | 118/730 |
| 6,730,175 B2 * | 5/2004 | Yudovsky et al. | 118/728 |
| 7,632,356 B2 * | 12/2009 | Tomita et al. | 118/728 |
| 7,832,354 B2 * | 11/2010 | Katz et al. | 118/723 R |
| 7,879,250 B2 * | 2/2011 | Katz et al. | 216/67 |
| 8,097,120 B2 * | 1/2012 | Dhindsa et al. | 156/345.33 |
| 2003/0136520 A1 * | 7/2003 | Yudovsky et al. | 156/345.51 |
| 2006/0207509 A1 * | 9/2006 | Tomita et al. | 118/728 |
| 2010/0139556 A1 * | 6/2010 | Kagami et al. | 118/58 |

FOREIGN PATENT DOCUMENTS

| | | |
|---|---|---|
| JP | 2001-203163 A | 7/2001 |
| JP | 2001-297991 A | 10/2001 |
| JP | 2002-518601 A | 6/2002 |
| WO | WO9967440 A2 | 12/1999 |

* cited by examiner

PURGE GAS ASSEMBLY

This application is a national phase entry under 35 U.S.C. §371 of PCT Patent Application No. PCT/JP2008/057846, filed on Apr. 23, 2008, which claims priority under 35 U.S.C. §119 to Japanese Patent Application No. 2007-124860, filed May 9, 2007, both of which are incorporated by reference.

TECHNICAL FIELD

The present invention relates to a purge gas assembly used in a processing apparatus which performs processing of film forming and the like on a surface mainly of a semiconductor substrate.

BACKGROUND ART

Conventionally, there is known a processing apparatus in which a substrate to be processed is placed on a substrate stage disposed inside an evacuated processing chamber and in which film-forming processing is performed by CVD method to form a thin film on a surface of the substrate. In this kind of processing apparatus, in case the processing to be performed on the surface of the substrate extends to the outer edge of the substrate so that a film is consequently deposited there, there is the following possibility, i.e., due to the possible peeling off of the film deposited on the outer edge, a bad effect such as particles, contamination and the like will be given to the subsequent processes such as chemical mechanical polishing (CMP) and the like.

As a solution, there is known in patent document 1 an arrangement in which a purge gas assembly is provided to flow a purge gas from a side of the substrate stage, to thereby prevent the processing to be performed on the surface of the substrate from affecting the outer edge of the substrate. In this arrangement, a shoulder portion is disposed on an outer circumferential portion of the substrate stage in a manner to offset downward below a substrate mounting surface which lies on an upper end of the substrate stage. A purge ring is disposed on the shoulder portion so as to enclose a circumferential surface of a stepped portion between the substrate mounting surface and the shoulder portion. An annular gas ejection passage to eject the purge gas is defined between the circumferential surface of the stepped portion and an inner circumferential surface of the purge ring. According to this configuration, the outer edge of the substrate is covered by the purge gas to be ejected from the gas ejection passage. As a result, the processing by the processing gas will not reach the outer edge of the substrate.

Unless the purge gas is ejected uniformly out of the gas ejection passage over the entire circumference thereof, there is a possibility that the film distribution on the surface of the substrate becomes abnormal. As a solution, in the arrangement described in the patent document 1, there is formed an annular recessed groove on an upper surface of the shoulder portion of the substrate stage. Purge gas inlets are provided at a plurality of positions in the circumferential direction on the bottom surface of the recessed groove. The purge gas is thus distributed in the circumferential direction inside the recessed groove before being supplied to the gas ejection passage.

However, due to the dimensional restriction in the shoulder portion, the cross sectional area of the recessed groove cannot be made so large, so that the distribution of the purge gas in the circumferential direction cannot be made uniform by the recessed groove alone. As a solution, in the arrangement described in the patent document 1, a coiled member is disposed within the recessed groove. By passing the purge gas through this member, the distribution in the circumferential direction can be made uniform.

In addition, in case the film-forming processing is performed by the CVD method, it is so arranged that the substrate is heated by the heat transmission from the substrate stage by means of a heating means for the substrate stage so that the film-forming processing on the surface of the substrate is accelerated. In this case, if the purge ring is heated by the heat transmission from the substrate stage, film is likely to be deposited on the upper surface of the purge ring. Therefore, in the arrangement descried in the patent document 1, the purge ring is constituted by a plurality of upper and lower ring members. Groove portions which serve to reduce the area of contact are formed between the ring members. In this manner, the heat to be transmitted from the substrate stage to the ring member on the upper side through the ring member on the lower side is restricted so that the film is hardly deposited on the upper surface of the uppermost ring member.

Patent document 1: JP-A-2001-297991

DISCLOSURE OF THE INVENTION

Problems to be Solved by the Invention

In the arrangement described in the patent document 1, the purge gas can be uniformly ejected from the gas ejection passage over the entire circumference thereof, and the deposition of the film on the upper surface of the purge ring can also be restricted. However, for that purpose, it becomes necessary to provide the coiled member and also to constitute the purge ring by a plurality of the upper and lower members. As a result, there are disadvantages in that the construction becomes complicated, that the maintenance becomes troublesome, and that the cost becomes high.

In view of the above points, this invention has a problem of providing a purge gas assembly which is capable of ejecting the purge gas uniformly over the entire circumference of the gas ejection passage, and which is simple in construction and capable of preventing the film from depositing, due to the heat, on the upper surface of the purge ring.

Means for Solving the Problems

In order to solve the above problems, there is provided, according to this invention, a purge gas assembly for flowing a purge gas to prevent processing to be performed on a substrate from affecting an outer edge of the substrate, the substrate being placed on a substrate stage disposed in a processing chamber, the purge gas flowing from a side of the substrate stage. The purge gas assembly comprises: a shoulder portion disposed along an outer circumference portion of the substrate stage in a manner to offset below a substrate mounting surface on an upper end of the substrate stage; a purge ring disposed on the shoulder portion in a manner to enclose a circumferential surface of a stepped portion formed between the substrate mounting surface and the shoulder portion; and an annular gas ejection passage for ejecting the purge gas, the gas ejection passage being defined between the circumferential surface of the stepped portion and an inner circumferential surface of the purge ring. The purge ring has formed therein an annular groove which concavely extends upward from a bottom surface of the purge ring, and a distribution chamber inside the annular groove is partitioned by an inner circumferential wall of the annular groove relative to the gas ejection passage. The distribution chamber is in fluid flow communication with the gas ejection passage on a lower side of the inner circumferential wall so that the purge gas is supplied to the gas ejection passage through the distribution chamber.

According to this invention, the purge gas is distributed in the circumferential direction inside the distribution chamber before being supplied to the gas ejection passage. Here, since the distribution chamber is constituted by the annular groove that is formed in the purge ring, that inside portion of the purge ring which lies on the outside of the gas ejection passage and which ordinarily becomes a dead space can be effectively utilized as a space for disposing therein the distribution chamber, and the distribution chamber can be secured large enough in cross-sectional area. As a consequence, without using a separate member to accelerate the distribution in the circumferential direction such as the coiled member in the above conventional example, the distribution of the purge gas in the circumferential direction inside the distribution chamber can be made uniform and the purge gas can therefore be ejected uniformly from the gas ejection passage over the entire circumference thereof.

Even if the heat of the substrate stage is transmitted to the purge ring, the purge ring can be efficiently cooled by the purge gas that flows through the distribution chamber within the purge ring. Therefore, without constituting the purge ring by a plurality of upper and lower members as in the above conventional example, the upper surface temperature of the purge ring will not rise. It is thus possible to restrict the deposition of a film, due to heat, on the upper surface of the purge ring.

As described hereinabove, according to this invention, the purge gas can be ejected from the gas ejection passage uniformly over the entire circumference thereof, and also the deposition of the film on the upper surface of the purge ring can be restricted. In addition, there is no need of providing a separate member for the purpose of accelerating the distribution of the purge gas and no need of constituting the purge ring by a plurality of upper and lower members. The construction thus becomes simpler and the maintenance becomes easier with the reduction in cost.

According to this invention, the purge gas assembly according to this invention preferably further comprises an enlarged diameter portion formed so as to become larger in diameter toward an upper side, the enlarged diameter portion being formed on an upper end portion of the inner circumferential surface of the purge ring. According to this arrangement, part of the purge gas to be ejected from the gas ejection passage becomes easier to flow along the enlarged diameter portion toward the upper surface of the purge ring. As a result, the deposition of the film on the upper surface of the purge ring can more effectively be prevented.

Further, the purge ring is preferably arranged on the shoulder portion so as to be detachable.

BEST MODE FOR CARRYING OUT THE INVENTION

FIG. 1 shows a processing apparatus which is provided with a purge gas assembly according to an embodiment of this invention. This processing apparatus is provided with a vacuum chamber 1 defining a processing chamber a, and a substrate stage 2 which is disposed in the processing chamber 1a. A film-forming processing is thus performed to form a thin film by CVD method on a surface of a substrate W of silicon wafer, glass and the like which is placed on the substrate stage 2.

The vacuum chamber 1 is evacuated by an evacuating means 3 which is connected to a bottom portion of the vacuum chamber 1. The processing chamber 1a is provided at its ceiling portion with a gas supply means 4 which supplies the processing chamber 1a with a process gas made up of a raw gas and a reactant gas. The gas supply means 4 is made up of a gas diffusion chamber 5 into which the process gas is supplied through a supply pipe 5a, and a shower plate 6 on a lower surface of the gas diffusion chamber 5. The process gas is ejected from a multiplicity of holes 6a formed in the shower plate 6, toward the substrate W.

The substrate stage 2 is supported by a hollow supporting column 7 which is vertically disposed on the bottom portion of the processing chamber 1a. Below the substrate stage 2 there is provided an elevating plate 9 which is moved up and down by a cylinder 8. The elevating plate 9 is provided with a plurality of lifting pins 10 which vertically penetrate through the substrate stage 2. The vacuum chamber 1 is provided at its peripheral wall portion with a transfer opening 11 with a gate valve. A transfer means (not illustrated) goes into and out of the processing chamber 1a through the transfer opening 11. Then, the processed substrate W is lifted off from the substrate stage 2 by the lifting pins 10 as a result of lifting the elevating plate 9. The substrate W is then transferred in this state to the transfer means to thereby carry it out of the processing chamber 1a. Further, a new substrate W is carried by the transfer means into the processing chamber 1 and is then transferred to the lifting pins 10. It is thus so arranged that the substrate W is placed on the substrate stage as a result of lowering the elevating plate 9.

Although not illustrated, the substrate stage 2 has assembled therein a heating means for controlling the temperature of the substrate W, and a differential pressure type of suction mechanism in order to prevent the displacement of the substrate W. Further, in order to prevent the film-forming processing to be performed on the surface of the substrate from being extended to the outer edge of the substrate W, the substrate stage 2 is provided with a purge gas assembly 12 which causes the purge gas (inert gas such as argon and the like) to flow from the side of the substrate stage 2. Detailed description will hereinafter be made of the purge gas assembly with reference to FIG. 2.

The purge gas assembly 12 is made up of; a shoulder portion 2b which is disposed on an outer circumferential portion of the substrate stage 2 and which is offset downward from the substrate mounting surface 2a on an upper end of the substrate stage 2; and a purge ring 13 which is disposed on the shoulder portion 2b. The purge ring 13 is disposed in a manner to enclose a stepped circumferential surface 2c between the substrate mounting surface 2a and the shoulder portion 2b. Between the stepped circumferential surface 2c and an inner circumferential surface of the purge ring 13, there is defined an annular gas ejection passage 14 for ejecting the purge gas.

The passage width of the gas ejection passage 14 is set in a range of 0.1 mm~5 mm depending on the amount of the purge gas. The diameter of the substrate mounting surface 2a is set in the range of the diameter of the substrate W minus 10 mm~plus 10 mm. In this embodiment, the diameter of the substrate mounting surface 2a is set to the diameter of the substrate W minus 3 mm, and the outer circumferential portion of the substrate W is slightly protruded toward the outside of the substrate mounting surface 2a.

The purge ring 13 has formed therein an annular groove 13a which concavely extends (or recesses) upward from the bottom surface of the purge ring 13. Due to the space inside the annular groove 13a, there is constituted a distribution chamber 15 which is partitioned by an inner circumferential wall 13b of the annular groove 13a relative to the gas ejection passage 14. Further, on an upper surface of the shoulder portion 2b, there is formed an annular recessed groove 16 which extends from the lower end of the gas ejection passage 14 to the lower end of the distribution chamber 15. On the lower side of the inner circumferential wall 13b, the distribution chamber 15 is communicated with the gas ejection passage 14 through the recessed groove 16. In a plurality of positions as seen in the circumferential direction of the bottom surface portion facing the distribution chamber 15 of the recessed groove 16, there are provided inlets 17 for the purge gas. The purge gas from a purge gas supply pipe 18 (see FIG. 1) which is disposed inside the supporting column 7 is arranged to flow through radial passages 19 which are provided in a lower portion of the substrate stage 2, and to flow from the inlet 17 to the distribution chamber 15.

The purge ring 13 is detachably fixed by bolts 20 to the upper surface of the outer circumferential portion of the shoulder portion 2b at the wall portion of the outer circumference of the annular groove 13a. The surface of connection between the purge ring 13 and the shoulder portion 2b has interposed therein a seal ring 21 to prevent the purge gas from leaking. In an upper outer end portion in the inner circumferential surface of the purge ring 13, there is formed an enlarged diameter portion 13c which becomes larger in diameter extends toward the upper side and is formed into a rounded shape. The enlarged diameter portion 13c may be formed into a taper. Further, on an upper surface of the purge ring 13, there is formed a slightly upward slope which is elongated radially outward from the enlarged diameter portion 13c.

Description will now be made of the function of the purge gas assembly 12 of this embodiment. The purge gas that has flown into the distribution chamber 15 is circumferentially distributed inside the distribution chamber 15 before flowing into the gas ejection passage 14. Then, the purge gas is ejected from the upper end of the gas ejection passage 14 toward the perimeter region of the substrate W. The purge gas having passed through the perimeter region of the substrate W flows from the upper side of the purge ring 13 downward through a clearance between the outer circumference of the purge ring 13 and the circumferential wall portion of the processing chamber 1 (1a), and is exhausted through suction by the evacuating means 3

By thus ejecting the purge gas toward the perimeter region of the substrate W, the outer edge of the substrate W is covered by the purge gas. The process gas thus ceases to come into contact with the outer edge of the substrate W. The film-forming processing can be prevented from being extended to the outer edge of the substrate, i.e., the deposition of the film can be prevented. Further, since the outer circumferential portion of the substrate W is slightly elongated outward of the substrate mounting surface 2a, the purge gas will hit the rear surface of the outer circumferential portion, whereby the process gas is inhibited from reaching the edge and backside of the substrate W. As a result, the process gas can be prevented from entering the minute or small clearance between the substrate W and the substrate mounting surface 2a, thereby deposition of a film on the rear surface of the substrate can be prevented.

In this embodiment, since the distribution chamber 15 is constituted into the annular groove 13a formed in the purge ring 13, that inside portion of the purge ring 13 which lies on the outside of the gas ejection passage 14 and which ordinarily becomes a dead space, can be effectively utilized as a space for disposing therein the distribution chamber 15. The distribution chamber 15 can thus be secured large enough in cross-sectional area. Therefore, without using a separate member such as a coiled member and the like which accelerates the distribution in the circumferential direction, the distribution in the circumferential direction of the purge gas can be equalized in the distribution chamber 15, and the purge gas can be ejected uniformly over the entire circumference from the gas ejection passage 14. As a result, there is no possibility of giving rise to abnormality in the film distribution on the surface of the substrate due to non-uniformity in the distribution in the circumferential direction of the purge gas to be ejected from the gas ejection passage 14.

Further, in this embodiment, even if the heat of the substrate stage 2 is transmitted to the purge ring 13, the purge ring 13 is efficiently cooled by the purge gas that flows through the distribution chamber 15 which lies therein. Therefore, even if the purge ring 13 is constituted by a single piece of member, the surface temperature of the purge ring 13 does not rise. The deposition of the film, due to heat, on the upper surface of the purge ring 13 can thus be restricted. Still furthermore, since there is formed the enlarged diameter portion 13c on an upper end portion of the inner circumferential surface of the purge ring 13, part of the purge gas to be ejected from the gas ejection passage 14 becomes easier to flow toward the upper surface of the purge ring 13 along the enlarged diameter portion 13c. The deposition of the film on the upper surface of the purge ring 13 can more effectively be prevented.

As described so far, according to this embodiment, separate members for accelerating the distribution of the purge gas in the circumferential direction are not required. In addition, since the purge ring 13 can be constituted by a single piece of member, the construction of the purge gas assembly 12 becomes simple and the ease of maintenance and reduction in cost can be attained. Furthermore, adjustment for optimization in each of the processing conditions can be performed by the change in shape only of the purge ring 13 and, thus, the handling of the changes in the processing conditions becomes easier.

Description has so far been made of the embodiment of this invention with reference to the accompanying figures. This invention, however, is not limited to the above. For example, in the above embodiment, an arrangement was made so that the purge gas can flow into the distribution chamber 15 from the lower side. It is, however, possible to flow the purge gas from the diametrically outside or the upper side of the distribution chamber 15. Still furthermore, in the above embodiment, there was formed in the shoulder portion 2b of the substrate stage 2 the recessed groove 16 which brings the distribution chamber 15 into communication with the gas ejection passage 14. Instead of forming the recessed groove 16, the inner circumferential wall 13b of the purge ring 13 may be formed so as to bring about a clearance between the lower end of the inner circumferential wall 13b and the upper surface of the shoulder portion 2b. The distribution chamber 15 and the gas ejection passage 14 may thus be arranged to be in fluid flow communication with each other through this clearance.

Further, in the above embodiment, the purge ring 13 is so arranged that the lower surface portion outside the seal ring 21 is in intimate contact with the upper surface of the shoulder portion 2b. It is, however, possible to arrange that the area of contact between the purge ring 13 and the shoulder portion 2b is minimized to thereby restrict the heat transmission from the substrate stage 2 to the purge ring 13.

Further, the purge gas assembly 12 of this invention functions most usefully in the film-forming processing by CVD method. The purge gas assembly 12 is, however, applicable to other processing such as etching, sputtering, and the like.

DESCRIPTION OF REFERENCE NUMERALS AND CHARACTERS

Figure 1:
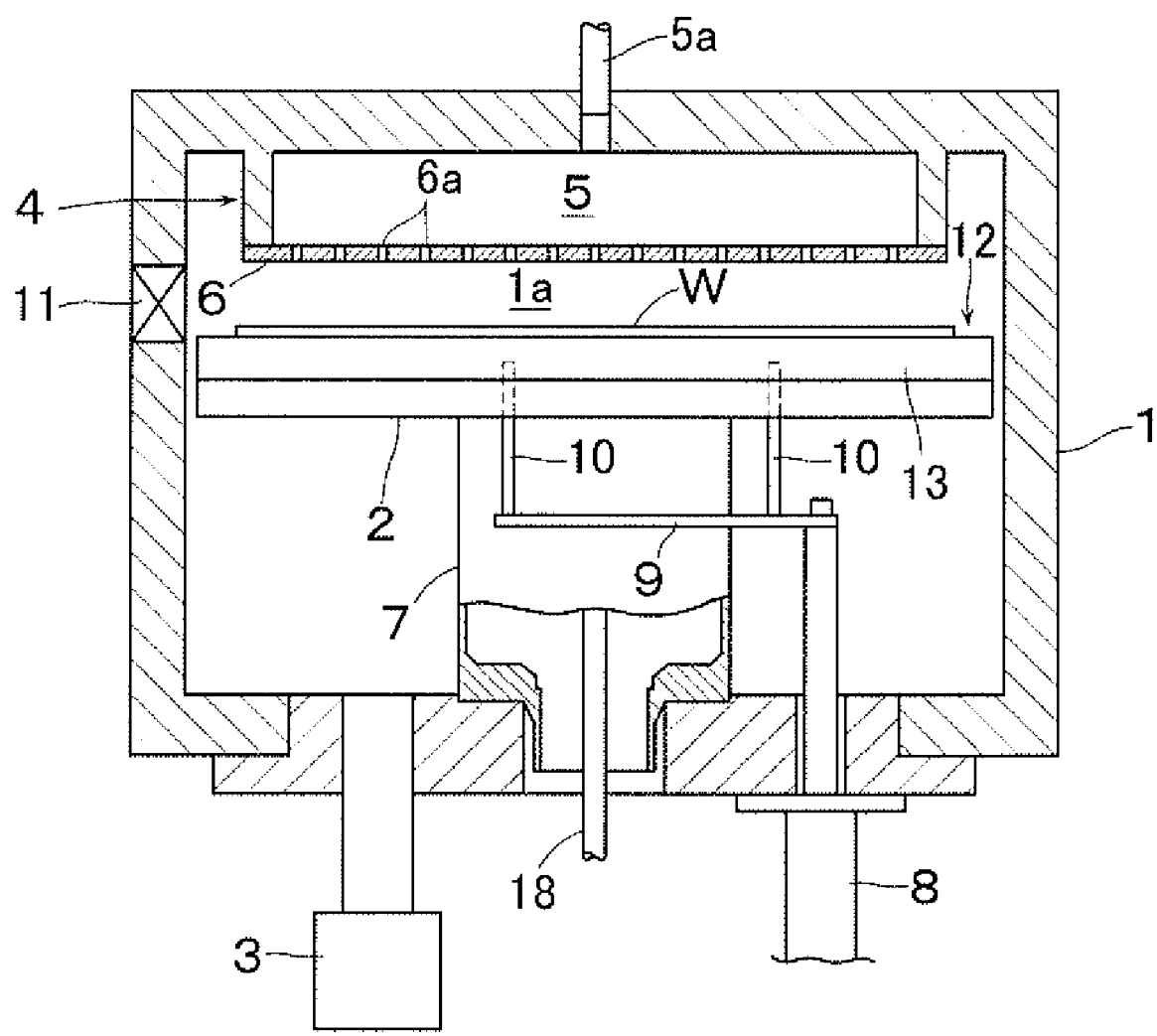
FIG. 1 is a schematic sectional view of a processing apparatus which is provided with a purge gas assembly of an embodiment of this invention.
Figure 2:
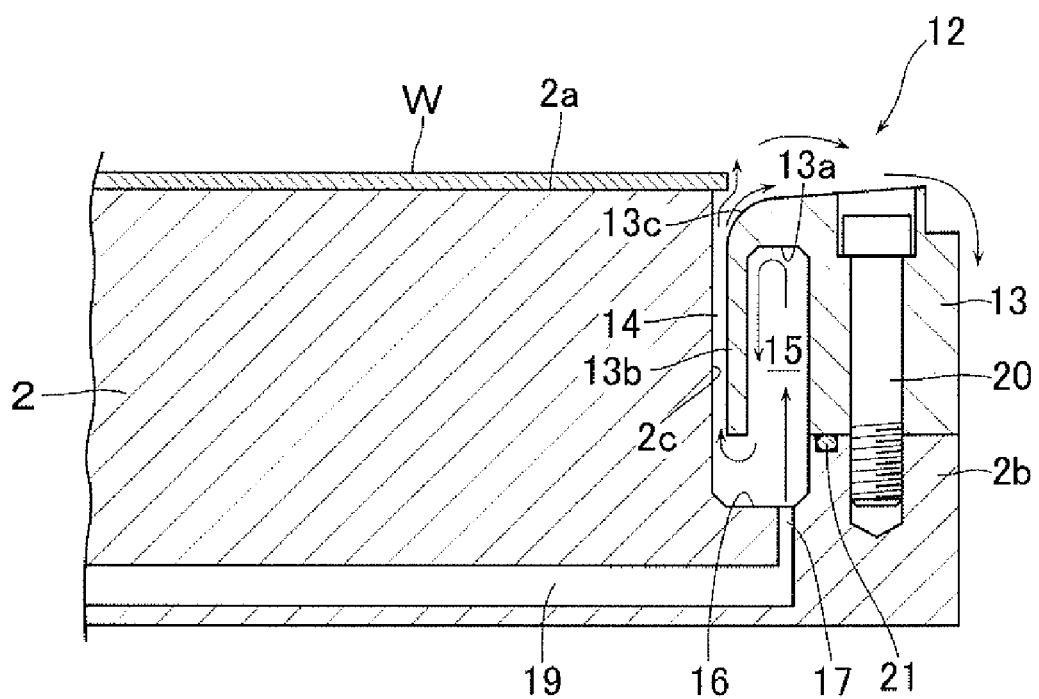
FIG. 2 is an enlarged sectional view of the purge gas assembly of the processing apparatus of FIG. 1.

1*a* processing chamber
2 substrate stage
2*a* substrate mounting surface
2*b* shoulder portion
2*c* stepped circumferential surface
12 purge gas assembly
13 purge ring
13*a* annular groove
13*b* inner circumferential wall
13*c* enlarged diameter portion
14 gas ejection passage
15 distribution chamber
W substrate

What is claimed is:

1. A purge gas assembly for flowing a purge gas to prevent processing to be performed on a substrate from affecting an outer edge of the substrate, the substrate being placed on a substrate stage disposed in a processing chamber, the purge gas flowing from a side of the substrate stage, the purge gas assembly comprising:
    a shoulder portion disposed along an outer circumference portion of the substrate stage in a manner to offset below a substrate mounting surface on an upper end of the substrate stage;
    a purge ring disposed on the shoulder portion in a manner to enclose a stepped circumferential surface formed between the substrate mounting surface and the shoulder portion; and
    an annular gas ejection passage for ejecting the purge gas, the gas ejection passage being defined between the circumferential surface of the stepped portion and an inner circumferential surface of the purge ring and being formed perpendicular to the substrate mounting surface,
    wherein the purge ring has formed therein an annular groove which concavely extends upward from a bottom surface of the purge ring, and
    wherein a distribution chamber inside the annular groove is partitioned by an inner circumferential wall of the annular groove relative to the gas ejection passage, the distribution chamber being in fluid flow communication with the gas ejection passage on a lower side of the inner circumferential wall so that the purge gas is supplied to the gas ejection passage through the distribution chamber.

2. The purge gas assembly according to claim 1, further comprising;
    an enlarged diameter portion formed so as to become larger in diameter toward an upper side, the enlarged diameter portion being formed below the substrate mounting surface and on an upper end portion of the inner circumferential surface of the purge ring.

3. The purge gas assembly according to claim 1,
    wherein the purge ring is detachably mounted on the shoulder portion.

4. The purge gas assembly according to claim 2,
    wherein the purge ring is detachably mounted on the shoulder portion.

5. The purge gas assembly according to claim 1,
    wherein a diameter of the substrate mounting surface is smaller than a diameter of the substrate.

6. The purge gas assembly according to claim 5,
    wherein the outer circumferential portion of the substrate is protruded toward the outside of the substrate mounting surface.

7. The purge gas assembly according to claim 1,
    wherein the stepped circumferential surface is formed at the side of the substrate stage.

* * * * *